United States Patent
Van De Graaff (10) Patent No.: US 9,257,995 B2
(45) Date of Patent: Feb. 9, 2016

(54) APPARATUSES AND METHODS FOR MITIGATING UNEVEN CIRCUIT DEGRADATION OF DELAY CIRCUITS

(71) Applicant: Micron Technology, Inc., Boise, ID (US)

(72) Inventor: Scott D. Van De Graaff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 23 days.

(21) Appl. No.: 14/034,411

(22) Filed: Sep. 23, 2013

(65) Prior Publication Data

US 2015/0084677 A1     Mar. 26, 2015

(51) Int. Cl.
*H03L 7/00* (2006.01)
*H03L 7/08* (2006.01)
*H03L 7/06* (2006.01)

(52) U.S. Cl.
CPC .. *H03L 7/00* (2013.01); *H03L 7/06* (2013.01); *H03L 7/08* (2013.01)

(58) Field of Classification Search
CPC ................ H03L 7/00; H03L 7/06; H03L 7/08
USPC ......... 327/261, 262, 263, 264, 266, 271, 274, 327/277, 278, 280, 281, 284, 285, 287, 288, 327/392, 393, 394, 395, 396, 399, 400, 401
See application file for complete search history.

(56) References Cited

U.S. PATENT DOCUMENTS

| | | | |
|---|---|---|---|
| 5,786,715 A * | 7/1998 | Halepete | ..................... 327/116 |
| 8,519,767 B2 | 8/2013 | Booth et al. | |
| 8,692,603 B2 | 4/2014 | Booth et al. | |
| 8,963,604 B2 | 2/2015 | Booth et al. | |
| 2014/0266359 A1 | 9/2014 | Ma | |

* cited by examiner

*Primary Examiner* — Jung Kim
(74) *Attorney, Agent, or Firm* — Dorsey & Whitney LLP (57) ABSTRACT

Apparatuses and methods for mitigating uneven circuit degradation of delay circuits are disclosed. In an example method, an imbalance in transistor threshold voltages is detected between a transistor of a first delay circuit and a transistor of a second delay circuit that is series coupled to the first delay circuit, and a clock level of an input clock signal to the first delay circuit is switched responsive to detecting the imbalance.

14 Claims, 5 Drawing Sheets

APPARATUSES AND METHODS FOR MITIGATING UNEVEN CIRCUIT DEGRADATION OF DELAY CIRCUITS

BACKGROUND

Integrated circuit memories use various clock signals to control the timing of internal operations. The clock signals may be generated by clock circuits included in the memories, which may include delay line circuits to adjust the timing of the clock signals relative to one another. In generating a clock signal, an input clock signal may be delayed through a delay line circuit to provide an output clock signal having a delay relative to the input clock signal. The delay line circuit ideally provides an output signal that is a true version of the input signal, but delayed. However, due to imbalances in electrical characteristics of circuits included in the delay line circuit, the input clock signal may be distorted as it propagates through the delay line circuit to provide the output clock signal. For example, a delay line circuit including circuits having imbalanced electrical characteristics may introduce duty cycle error when providing an output clock signal.

Electrical characteristics of circuits may become imbalanced due to operating conditions to which the circuits are subject during normal operation. For example, particular ones of the circuits included in a delay line circuit may be subjected to operating conditions (e.g., voltage and/or current conditions) that cause degradation of the electrical characteristics for those particular circuits. Other similar circuits also included in the delay line circuit, however, may not be subjected to the same operating condition and consequently do not degrade to the same extent. Thus, the circuits of the delay line circuit, which in theory should operate similarly, degrade unevenly. The resulting performance of the circuits subjected to the operating condition may be different than the performance of the circuits not subjected to the operating condition. The difference in performance of the circuits may cause the circuits to distort an input signal clock as it propagates through the delay line circuit to provide an output clock signal. As known, a distorted output clock signal may significantly limit memory performance.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
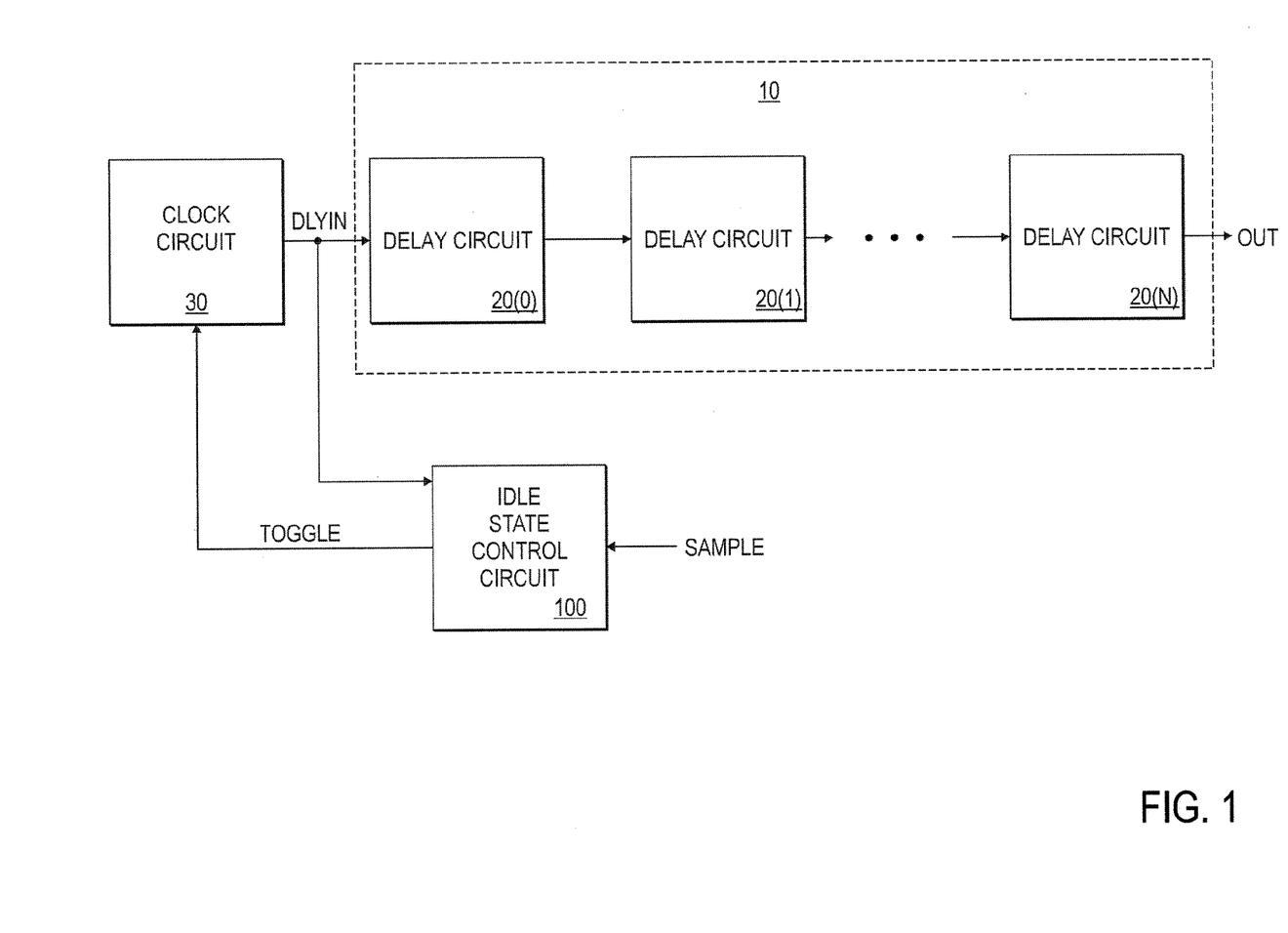
FIG. 1 is a block diagram of an apparatus that includes a delay line idle state control circuit according to an embodiment of the invention.

FIG. 1 illustrates an apparatus that includes a delay line idle state control circuit 100 according to an embodiment of the invention. The control circuit 100 is coupled to a delay line circuit 10 that is configured to delay an input signal DLYIN to provide an output signal OUT. The DLYIN signal may be provided by a clock circuit 30, and have a clock level (e.g., a high clock level or a low clock level). A high clock level may correspond to a supply voltage, such as VCC, and a low clock level may correspond to a reference voltage, such as ground. The DLYIN signal provided to the delay line circuit 10 may be an active clock signal, that is, a clock signal that periodically transition between the high clock level and the low clock level. The DLYIN signal may also be inactive, for example, during an idle state, where the DLYIN signal maintains a constant clock level and does not transition between the high and low clock levels. An idle state may be entered, for example, to save power by reducing the switching power consumed by a clock distribution circuit.

The delay line circuit 10 includes a plurality of delay circuits 20. The delay line circuit 10 is shown in FIG. 1 as including N+1 delay circuits 20(0)-20(N). The delay circuits 20(0)-20(N) are configured to delay a respective input signal to provide a respective output signal when enabled, with each delay circuit 20 providing a unit delay as the IN signal propagates through the delay line circuit 10 and output as the OUT signal. In some embodiments, a delay circuit is configured to invert the clock level of respective input signal to provide the respective output signal. As a result, the clock level of the respective input clock signals to the first, third, fifth, etc. (e.g., "odd") delay circuits will have the opposite clock level of the respective input clock signals to the second, fourth, sixth, etc. (e.g., "even") delay circuits. A delay stage (not shown in FIG. 1) may include a plurality of delay circuits 20. For example, in some embodiments, a delay stage may include two delay circuits coupled in series, with the resulting respective output signal being true (e.g., not inverted) relative to the delay stage's respective input clock signal.

The control circuit 100 is provided the DLYIN signal from the input of the delay line circuit 10. The control circuit 100 may include a model circuit that models a circuit or circuits of the delay circuits 20(0)-20(N). The model circuits may be subjected to the same operating conditions, as the DLYIN signal is provided to the model circuits. The control circuit may be configured to sample an electrical characteristic of the model circuit, and based on the electrical characteristic, provide a control signal TOGGLE. The TOGGLE signal may be used to control the clock level of the DLYIN provided to the delay line 10. For example, the TOGGLE signal may be provided to the clock circuit 30 to cause the clock level of the DLYIN signal to be switched from a high clock level to a low clock level, or to be switched from a low clock level to a high clock level. The control circuit 100 may in some embodiments be configured to sample the electrical characteristic of the model circuit responsive to an idle state and provide the TOGGLE signal to control the clock level of the DLYIN signal during the idle state. In some embodiments, the control circuit 100 may be alternatively, or additionally, configured to sample the electrical characteristic of the model circuit periodically, or responsive to a command.

Controlling the clock level of the DLYIN signal may help balance degradation of circuits of the delay circuits 20(0)-20(N) that may be caused by voltages associated with the clock levels of the DLYIN signal. For example, when an inactive clock signal is provided to the delay line circuit 10, circuits of the even delay circuits may be subjected to different voltages than the circuits of the odd delay circuits. The voltage conditions may be such that p-channel field effect transistors (pFETs) included in the delay circuits 20(0)-20(N) may experience NBTI degradation. Imbalanced degradation of the pFETs may cause the delay circuits 20(0)-20(N) to inject duty cycle error as the DLYIN signal is propagated through the delay circuits 20(0)-20(N) to provide the OUT signal. In embodiments having delay stages including two series coupled delay circuits 20, a pFET of the first delay circuit may degrade differently than a corresponding pFET of the second delay circuit due to the different clock levels applied to the pFETs by an inactive clock signal. As known, NBTI degradation may cause threshold voltages of the pFETs to shift, thereby causing uneven rise times by those pFETs of the delay circuits 20(0)-20(N) that are more degraded than lesser degraded pFETs of the delay circuits 20(0)-20(N).

Figure 2:
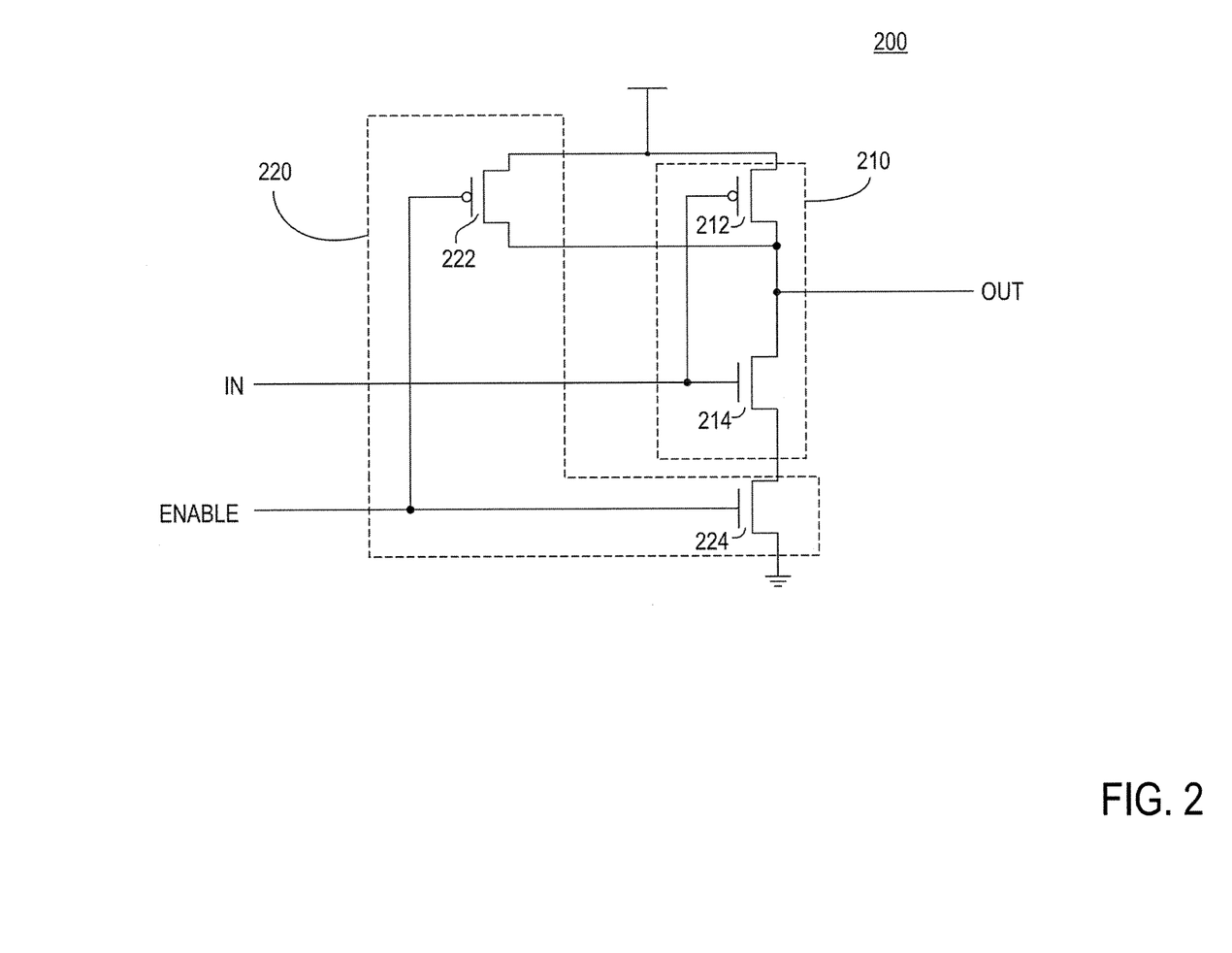
FIG. 2 is a block diagram of a delay circuit according to an embodiment of the invention.

FIG. 2 illustrates a delay circuit 200 according to an embodiment of the invention. The delay circuit 200 may be used for the delay circuits 20 of FIG. 1. The delay circuit includes an inverter 210 that includes a p-type pull-up transistor 212 and an n-type pull-down transistor 214. In the particular embodiment of FIG. 2, the p-type transistor 212 is shown as a pFET, and the n-type transistor 214 is shown as an n-channel field effect transistor (nFET). The inverter is configured to receive an input signal IN and provide an output signal OUT at an output node that is the complement of the IN signal. An enable circuit 220 is coupled to the inverter 210 to enable the inverter responsive to an active enable signal ENABLE. The enable circuit 220 includes a p-type transistor 222 coupled the output node and configured to be coupled to a voltage supply (e.g., a voltage supply that provides a supply voltage VCC) and includes an n-type transistor 224 coupled to the n-type pull-up transistor 214 and configured to be coupled to a voltage reference (e.g., ground). The circuit 200 is enabled responsive to an active ENABLE signal (e.g., active high ENABLE signal) that is provided to the transistor 222 and the transistor 224. In some embodiments, to delay circuits 200 may be coupled in series and share a common ENABLE signal, so that both of the delay circuits 200 are enabled and disabled together responsive the ENABLE signal.

In operation, the delay circuit 200 is disabled by a low logic level ENABLE signal, which causes the transistor 224 to be non-conductive and the transistor 222 to be conductive. As a result, the OUT signal provided by the inverter 210 is held at a high logic level. An active ENABLE signal causes the transistor 222 to be non-conductive and the transistor 224 to be conductive. With the pull-down transistor 214 coupled to the voltage reference and the transistor 222 non-conductive, the output node of the inverter 210 may be coupled to the voltage supply or the voltage reference based on the IN signal to provide an OUT signal having a complementary logic level to the IN signal.

When a circuit including the delay circuit 200 is in an idle state, an inactive clock signal is provided to the delay circuit 200. As previously described, an inactive clock signal is a clock signal that has a constant clock level, and does not transition between high and low clock levels. In contrast, an active clock signal transitions periodically between the high and low clock levels. Although an inactive clock signal may be provided to the delay circuit 200 during an idle state, an already enabled delay circuit may remain enabled. For an enabled delay circuit, as previously discussed, the ENABLE signal is at a high logic level. While the delay circuit 200 is enabled during an idle state, and an inactive clock signal having a low clock level is provided as the IN signal, the p-type pull-up transistor 212 may experience NBTI degradation. In an example with two delay circuits coupled in series, while the p-type pull-up transistor 212 of the first delay circuit may be provided a low clock level signal, the p-type pull-up transistor 212 of the second delay circuit will be provided a high clock level signal, or vice versa. As a result, the p-type pull-up transistors 212 of the first and second delay circuits may degrade unevenly. As previously discussed, uneven NBTI degradation of the circuits of delay circuits of a delay line circuit may cause delay line circuit to introduce duty cycle error when delaying a clock signal. Thus, it is desirable to mitigate uneven NBTI degradation for the delay circuits of a delay line circuit.

Figure 3:
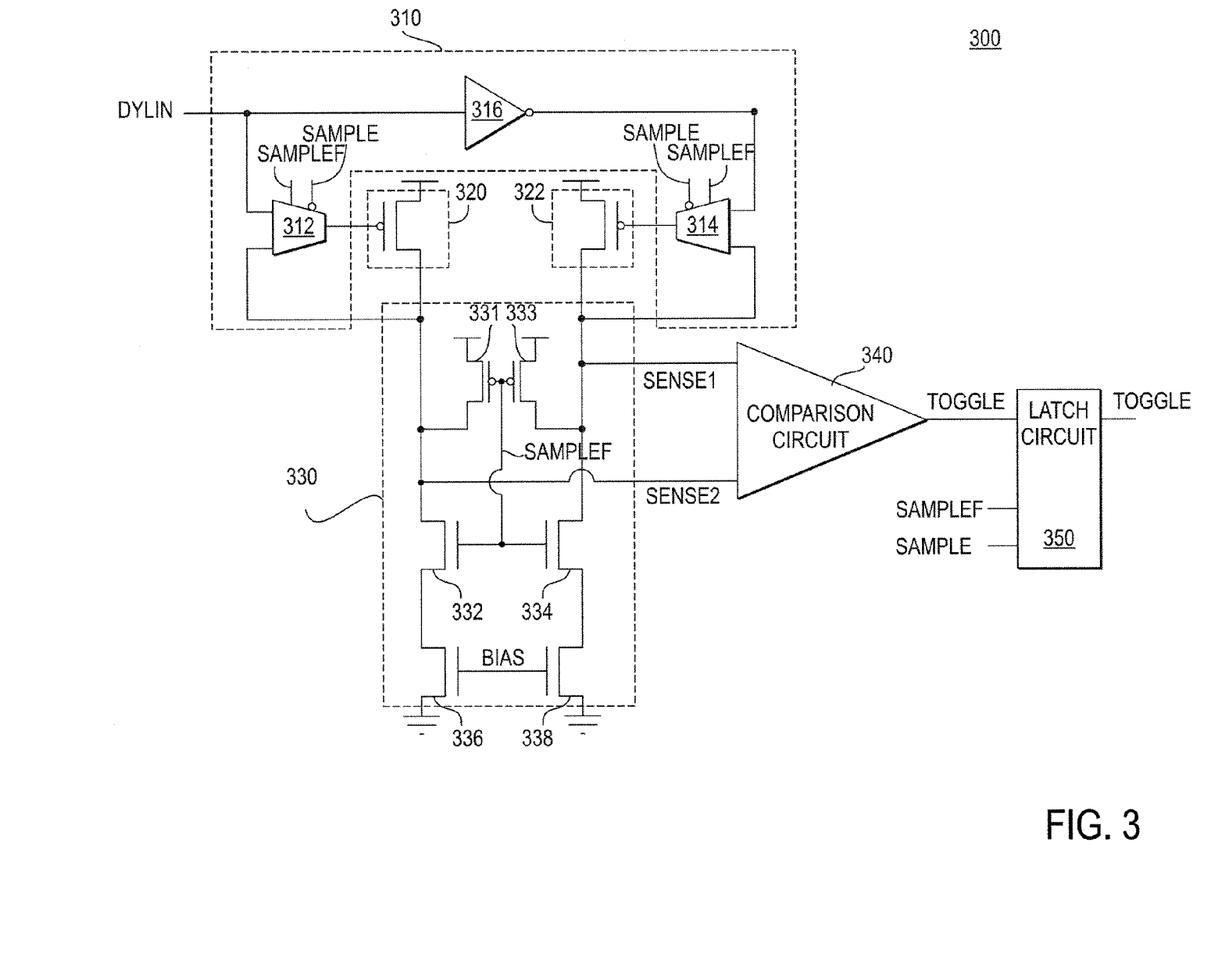
FIG. 3 is a schematic diagram of a delay line idle state control circuit according to an embodiment of the invention.

FIG. 3 illustrates a delay line idle state control circuit 300 according to an embodiment of the invention. The delay line state control circuit 300 may be used for the delay line idle circuit control circuit 100 of FIG. 1. The control circuit 300 includes a sample circuit 310 coupled to model circuits 320 and 322, which are coupled to a bias circuit 330. The sample circuit 310 is configured to enable sampling of model circuits 320, 322 responsive to an active (e.g., active low) activation signal SAMPLE. The model circuits 320, 322 are configured to model circuits of a delay circuit. The model circuit 320 may model a circuit in a first delay circuit and the model circuit 322 may model the corresponding circuit in a second delay circuit. During sampling, the bias circuit 330 provides a bias (e.g., bias current, bias voltage, etc.) to the model circuits 320, 322 resulting in first and second sense signals SENSE1 and SENSE2 provided to a comparison circuit 340. The SENSE1 and SENSE2 signals may be representative of an electrical characteristic of the model circuit 320, 322, which may in turn, be representative of a degree of NBTI degradation of the model circuits 320, 322. For example, in some embodiments, the SENSE1 and SENSE2 signals may be representative of the respective threshold voltages (VTs) of the model circuits 320 and 322. The comparison circuit 340 compares the SENSE1 and SENSE2 signals and provides an output signal TOGGLE based on the comparison. The TOGGLE signal may be provided to a latch circuit 350 to be latched. The latched TOGGLE signal may be provided, for example, to control (e.g., switch or maintain) the clock level of a clock signal provided to a delay line circuit (e.g., provided to a clock circuit, such as clock circuit 30 of FIG. 1).

As previously discussed, the model circuits 320, 322 are configured to model a circuit of a delay circuit. In the embodiment shown in FIG. 3, the model circuits 320, 322 may model circuits, for example, included in delay circuit 200 of FIG. 2. In particular, the model circuits 320 and 322 are shown in FIG. 3 as p-type transistors, and may model p-type transistor 212 of the delay circuit 200, with the model circuit 320 modeling a p-type transistor 212 of a first delay circuit and the model circuit 322 modeling the p-type transistor 212 of a second delay circuit that is coupled in series with the first delay circuit. It will be appreciated, however, the model circuit 320, 322 may be circuits other than the p-type transistors shown in FIG. 3 in other embodiments. The particular circuit of the model circuit may be based in part on the particular circuit of a delay circuit being modeled.

In operation, an inactive SAMPLE signal (e.g., a high logic level SAMPLE signal and a low logic level SAMPLEF signal) causes the multiplexer 312 to provide a DLYIN signal to model circuit 320, and causes the multiplexer 314 to provide an inverted DLYIN signal, as inverted by inverter 316, to the model circuit 322. As previously discussed the DLYIN signal may have a clock level, such as a high clock level or a low clock level. Responsive to the clock level of the DLYIN signal (and the inverted DLYIN signal), either the model circuit 320 or 322 will be conductive. By applying the DLYIN signal and the inverted DLYIN signal to the model circuits 320 and 322, the model circuits 320 and 322 may be subjected to a simulated operating condition to which circuits in the delay circuits are subjected. Degradation of the circuits in the delay circuits being modeled that result from the operating condition being simulated will likewise occur for the model circuits 320 and 322. Thus, sampling the electrical characteristic of the model circuits 320 and 322 may provide information representative of the degree of degradation of the circuits in the delay circuits being modeled. The inactive SAMPLE signal further causes the bias circuit 330 to provide the model circuits 320 and 322 a supply voltage, provided by transistors 331 and 333. As a result, a supply voltage is provided to both a source and drain of the model circuits 320 and 322. Additionally, both the SENSE1 and SENSE2 signals have a voltage equal to the supply voltage, causing the comparison circuit 340 to provide an inactive (e.g., low logic level) TOGGLE signal.

When a sample operation is to be performed, an active SAMPLE signal is provided to the delay line idle state control circuit 300. An active SAMPLE signal (e.g., a low logic level SAMPLE signal, and a high logic level SAMPLEF signal) causes the multiplexers 312 and 314 to couple gates of the model circuits 320, 322 to respective drains. The active SAMPLE signal further causes the bias circuit 330 to provide a bias current to the model circuits 320 and 322 by coupling the drains of the model circuits 320 and 322 to the reference voltage through n-type transistors 332 and 334, and through n-type transistors 336 and 338. The n-type transistors 336 and 338 are provided a voltage bias signal BIAS to set the bias current provided to the model circuits 320 and 322. With the gates of the model circuits 320 and 322 coupled to the respective drains, and a bias current provided by the bias circuit 330, voltages of the SENSE1 and SENSE2 signals represent the VTs of the model circuits 322 and 320, respectively. The comparison circuit 340 compares the SENSE1 and SENSE2 signals and provides a TOGGLE signal indicative of whether VTs of the model circuits 320 and 322 are different. A subsequent inactive SAMPLE signal causes the latch circuit 350 to latch the state of the TOGGLE signal resulting from the comparison. As previously discussed, the latched TOGGLE signal may be provided to control the clock level of a clock signal, for example, provided to a delay line circuit.

As previously described, the comparison circuit 340 compares a difference of the VTs of the model circuits 320 and 322. Responsive to the VTs being relatively the same, the comparison circuit 340 provides a TOGGLE signal having a low logic level. In contrast, responsive to a difference in the VTs, the comparison circuit 340 provides a TOGGLE signal having a high logic level. A high logic level TOGGLE signal may be used by a delay circuit, for example, to cause an input clock signal to a delay line circuit to switch clock levels. The comparison circuit 340 may be configured to allow for a range of VT difference before providing a high logic level TOGGLE signal indicative of a detected difference. For example, the comparison circuit 340 may be internally biased or include circuitry so that a VT difference in excess of a threshold (e.g., +/−10% volts of nominal VT) causes the comparison circuit 340 to switch from providing a low logic level TOGGLE signal to a high logic level TOGGLE signal.

Figure 4:
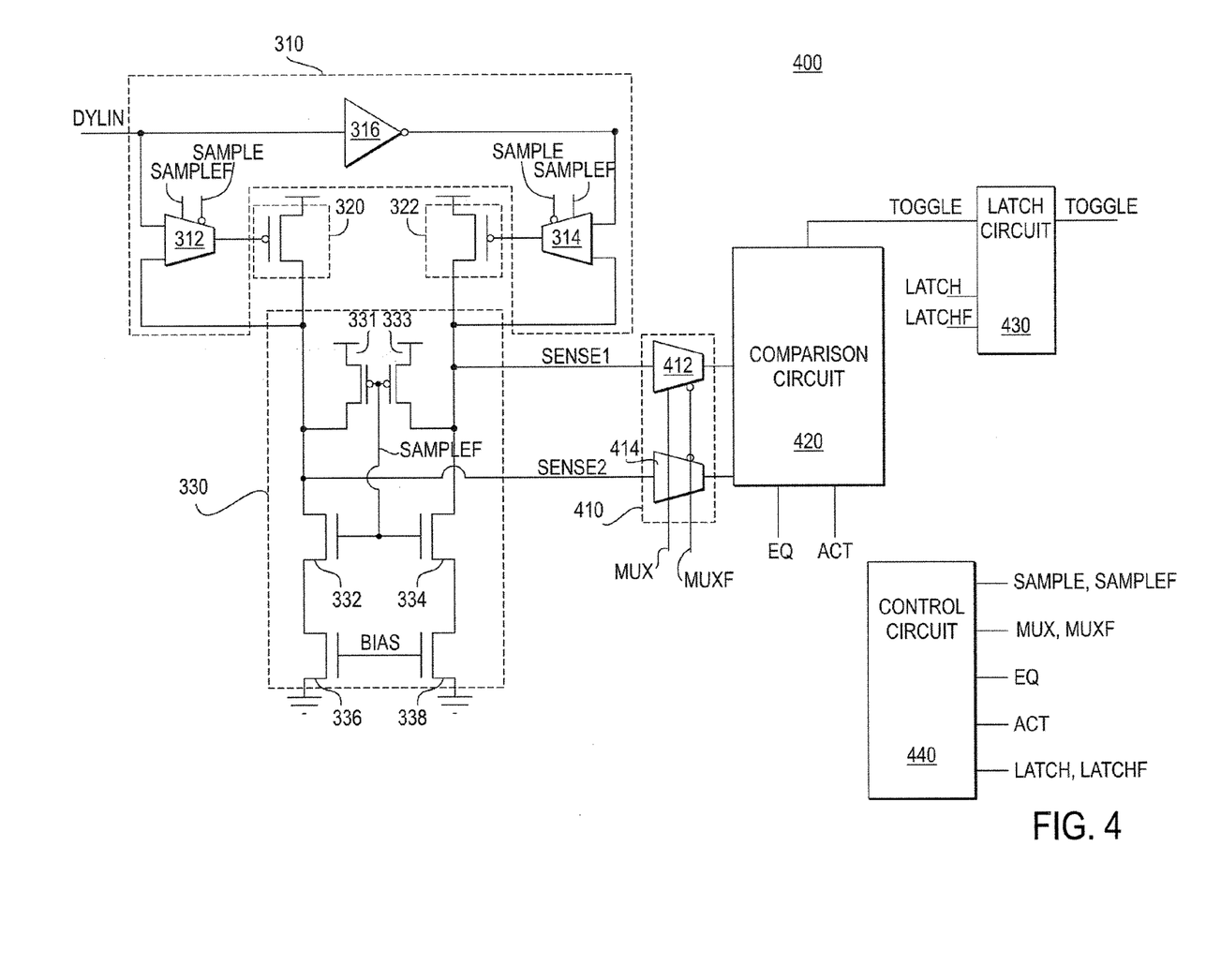
FIG. 4 is a schematic diagram of a delay line idle state control circuit according to an embodiment of the invention.

FIG. 4 illustrates a delay line idle state control circuit 400 according to an embodiment of the invention. The delay line state control circuit 400 may be used for the delay line idle state control circuit 100 of FIG. 1. The delay line state control circuit 400 includes circuits that were previously described with reference to the delay line idle state control circuit 300 of FIG. 3, which are identified in FIG. 4 using the same reference numbers. In particular, the delay line idle state control circuit 400 includes a sample circuit 310, model circuits 320 and 322, and a bias circuit 330. The sample circuit 310 is configured to enable sampling of model circuits 320, 322, which may be configured to model a circuit of first and second series-coupled delay circuits. The bias circuit 330 provides a bias (e.g., bias current, bias voltage, etc.) to the model circuits 320, 322 resulting in first and second sense signals SENSE1 and SENSE2. The SENSE1 and SENSE2 signals may be representative of an electrical characteristic of the model circuits 320, 322, which may in turn, be representative of a degree of NBTI degradation of the model circuits 320, 322. For example, in some embodiments, the SENSE1 and SENSE2 signals may be representative of the respective threshold voltages (VTs) of the model circuits 320 and 322.

The delay line idle state control circuit 400 further includes a comparison input circuit 410 coupled to the bias circuit 330 to receive the SENSE1 and SENSE2 signals, and is configured to provide the SENSE1 and SENSE2 signals, as controlled by control signals MUX and MUXF, to a comparison circuit 420. The comparison input circuit 410 may include multiplexers 412 and 414 to provide the SENSE1 and SENSE2 signals, respectively. The comparison circuit 420 is set-up for comparison by an equilibration signal EQ and activated by a comparison activation signal ACT to compare the SENSE1 and SENSE2 signals and provide an output signal TOGGLE having a logic level based on the comparison. In some embodiments, the comparison circuit 420 may be a sense amplifier circuit. A latch circuit 430 coupled to the comparison circuit 420 is configured to latch the TOGGLE signal responsive to latch signals LATCH and LATCHF. As previously discussed, the TOGGLE signal may be provided, for example, to control the clock level of an input clock signal provided to a delay line circuit (e.g., provided to a clock circuit, such as clock circuit 30 of FIG. 1).

A control circuit 440 is configured to provide various signals for operation of the delay line idle state control circuit 400. For example, the control circuit may be configured to provide the SAMPLE and SAMPLEF signals to enable the sample circuit 310 and the bias circuit 330, the MUX and MUXF signals to control the comparison input circuit 410, the EQ and ACT signals for operation of the comparison circuit 420, and the LATCH and LATCHF signals for causing the latch circuit 430 to latch the TOGGLE signal. The control circuit 440 may include circuits to provide the various signals having the timing relative to one another to perform a sample operation and provide a TOGGLE signal.

In operation, active SAMPLE and SAMPLEF signals are provided to the sample circuit 310 and the bias circuit 330 to sample the model circuits 320 and 322 and provide the SENSE1 and SENSE2 signals, as previously described with reference to the delay line idle state control circuit 300 of FIG. 3. While the SENSE1 and SENSE2 signals are developing responsive to the bias current provided by the bias circuit 330, the comparison circuit 420 may be set-up in preparation for receiving the SENSE1 and SENSE2 signals responsive to an active EQ signal. Following the development of the SENSE1 and SENSE2 signals and the set-up of the comparison circuit 420, the comparison input circuit 410 may be activated by active MUX and MUXF signals to provide the SENSE1 and SENSE2 signals to the comparison circuit 420 for comparison. Additionally, the comparison circuit 420 is activated by an active ACT signal to compare the SENSE1 and SENSE2 signals to provide the TOGGLE signal based on the comparison. The latch circuit may latch the TOGGLE signal responsive to the LATCH and LATCHF signals.

As previously discussed, the TOGGLE signal may be provided, for example, to control the clock level of an input clock signal to a delay line circuit. A logic level of the TOGGLE signal may indicate whether the difference of the VTs of the model circuits 320 and 322 are such that a clock level for the delay circuit should be switched, for example, to balance circuit degradation due to an operating condition during an idle state to which circuits of the delay circuits modeled by the model circuits 320 and 322 are subjected. Where the clock levels provided to the delay circuits during an idle state have caused the p-type transistors of even and odd delay circuits to have detectable VT difference, as represented by the SENSE1 and SENSE2 signals and detected by the comparison circuit 420, the TOGGLE signal may indicate that the clock level of the input signal should be switched so that the idle condition that caused the imbalance can be applied to the p-type transistors of the opposite delay circuits. In this manner, imbalance of device degradation may be mitigated.

Figure 5:
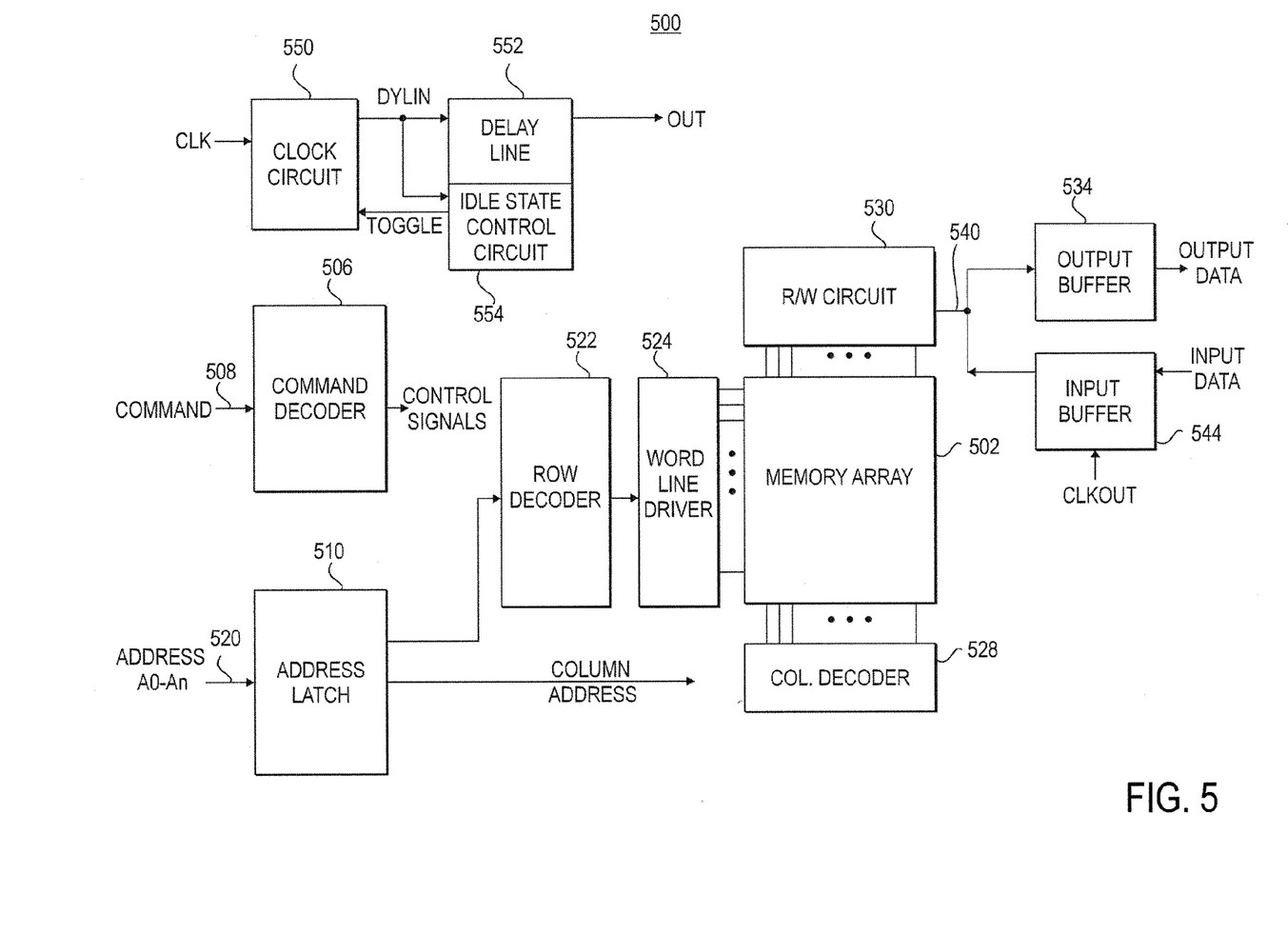
FIG. 5 is a block diagram of a memory system including a delay line idle state control circuit according to an embodiment of the invention.

FIG. 5 illustrates a portion of a memory 500 according to an embodiment of the present invention. The memory 500 includes an array 502 of memory cells, which may be, for example, volatile memory cells (e.g., DRAM memory cells, SRAM memory cells, etc.), non-volatile memory cells (e.g., NAND/NOR flash memory cells, phase change memory cells, etc.), or some other types of memory cells. The memory 500 includes a command decoder 506 that receives memory commands through a command bus 508 and generates corresponding control signals within the memory 500 to carry out various memory operations. Row and column address signals are applied to the memory 500 through an address bus 520 and provided to an address latch 510. The address latch then outputs a separate column address and a separate row address.

The row and column addresses are provided by the address latch 510 to a row address decoder 522 and a column address decoder 528, respectively. The column address decoder 528 selects bit lines extending through the array 502 corresponding to respective column addresses. The row address decoder 522 is connected to word line driver 524 that activates respective rows of memory cells in the array 502 corresponding to received row addresses. The selected data line (e.g., a bit line or bit lines) corresponding to a received column address are coupled to a read/write circuitry 530 to provide read data to a data output buffer 534 via an input-output data bus 540. Write data are applied to the memory array 502 through a data input buffer 544 and the memory array read/write circuitry 530. The command decoder 506 responds to memory commands applied to the command bus 508 to perform various operations on the memory array 502. In particular, the command decoder 506 is used to generate internal control signals to read data from and write data to the memory array 502.

The memory further includes a clock circuit 550 configured to provide an input clock signal DLYIN to a delay line circuit 552, which provides a delay to the DLYIN signal to provide an output clock signal OUT. The OUT signal may be used, for example, for controlling the timing of internal circuits. A delay line idle state control circuit 554 according to an embodiment of the invention is coupled to the clock circuit 550 to receive the DLYIN signal. The delay line idle state control circuit 554 is configured to provide a TOGGLE signal to the clock circuit 550, which may be used to control a clock level provided to the delay line circuit 552, as previously described.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
    a first delay circuit configured to receive an input clock signal having a first clock level and provide a delay thereto to provide an output signal having a second clock level different than the first clock level;
    a second delay circuit coupled to the first delay circuit and configured to receive the output signal; and
    an idle state control circuit configured to determine an imbalance between an electrical characteristic associated with a circuit of the first delay circuit and the electrical characteristic associated with a same circuit of the second delay circuit, the idle state control circuit further configured to cause the clock level of the input clock signal to switch responsive to determining the imbalance.

2. The apparatus of claim 1 wherein the first delay circuit comprises an inverter circuit including a p-channel transistor and an n-channel transistor.

3. The apparatus of claim 2 wherein the idle state control circuit comprises a first model circuit that includes a p-channel transistor configured to model the p-channel transistor of the inverter.

4. The apparatus of claim 1 wherein the electrical characteristic of the first delay circuit comprises a transistor threshold voltage.

5. The apparatus of claim 3 wherein the idle state control circuit further comprises:
    a sample circuit coupled to the first model circuit and configured to enable sampling of the first model circuit;
    a bias circuit coupled to the first model circuit and configured to bias the first model circuit for sampling and provide a first sense signal representative of the electrical characteristic of the first model circuit and further configured to provide a second sense signal;
    a comparison circuit coupled to the bias circuit and configured to compare the first and second sense signals and provide an output signal based on the comparison; and
    a latch circuit coupled to the comparison circuit and configured to latch the output signal.

6. The apparatus of claim 5 wherein the bias circuit comprises:
    a first transistor configured to provide a supply voltage to the first model circuit responsive to the first model circuit being disabled;
    a bias transistor to set a bias current; and
    a second transistor configured to couple the first model circuit to the bias transistor responsive to the first model circuit being enabled.

7. The apparatus of claim 5 wherein the idle state control circuit further comprises:
    a comparison input circuit coupled to the comparison circuit and configured to provide the first and second sense signals to the comparison circuit responsive to a control circuit,
    wherein the comparison circuit is configured to be set-up for comparison responsive to an equilibration signal and activated by a comparison activation signal to compare the first and second sense signals.

8. The apparatus of claim 5 wherein the sample circuit comprises:
    an inverter configured to receive a signal indicative of a clock level of the clock signal and provide an inverted clock level signal at an output; and a multiplexer coupled to the first model circuit and configured to couple a gate of the first model circuit to an output of the inverter or to a drain of the first model circuit.

9. The apparatus of claim 1 wherein the idle state control circuit includes a first model circuit configured to model the circuit of the first delay circuit and further includes a second model circuit configured to model the same circuit of the second delay circuit.

10. The apparatus of claim 9 wherein the circuit of the first delay circuit comprises a first p-channel transistor and the same circuit of the second delay circuit comprises a second p-channel transistor.

11. The apparatus of claim 1 wherein the idle state control circuit is configured to determine an imbalance between a transistor threshold voltage of a first transistor representing a transistor included in the first delay circuit and a transistor threshold voltage of a second transistor representing a transistor included in the second delay circuit.

12. The apparatus of claim 11 wherein the idle state control circuit is configured to bias the first and second transistors to provide first and second signals representative of the threshold voltages of the respective transistors, the idle state control circuit further configured to compare the first and second signals and provide a toggle signal based on the comparison having a logic level that is representative of the imbalance.

13. The apparatus of claim 12 wherein the idle state control circuit is configured to provide a bias current to the first and second transistors to bias the first and second transistors.

14. The apparatus of claim 1 wherein the first delay circuit comprises:
    an inverter having a p-channel pull-up transistor and an n-channel pull-down transistor;
    a p-channel transistor coupled in parallel to the p-channel pull-up transistor; and
    an n-channel transistor coupled in series with the n-channel pull-down transistor.

* * * * *